(12) United States Patent
Iltchenko

(10) Patent No.: US 6,798,947 B2
(45) Date of Patent: Sep. 28, 2004

(54) COUPLING SYSTEM TO A MICROSPHERE CAVITY

(75) Inventor: Vladimir Iltchenko, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 39 days.

(21) Appl. No.: 10/150,907

(22) Filed: May 17, 2002

(65) Prior Publication Data

US 2003/0012504 A1 Jan. 16, 2003

Related U.S. Application Data

(63) Continuation-in-part of application No. 09/501,824, filed on Feb. 10, 2000, now Pat. No. 6,389,197.

(51) Int. Cl.[7] .................................................. G02B 6/42
(52) U.S. Cl. .............................. 385/31; 385/28; 385/30; 385/37; 372/9
(58) Field of Search ................................ 385/14, 31, 9, 385/37–39, 42–50; 372/9

(56) References Cited

U.S. PATENT DOCUMENTS

| | | | | |
|---|---|---|---|---|
| 5,926,496 A | * | 7/1999 | Ho et al. | ........................ 372/92 |
| 6,009,115 A | * | 12/1999 | Ho | ............................... 372/92 |
| 6,389,197 B1 | * | 5/2002 | Iltchenko et al. | .............. 385/28 |
| 6,488,861 B2 | * | 12/2002 | Iltchenko et al. | .............. 216/24 |

* cited by examiner

*Primary Examiner*—Phan T. H. Palmer
(74) *Attorney, Agent, or Firm*—Fish & Richardson P.C.

(57) ABSTRACT

At technique for holding a resonator relative to an optical fiber at a specified distance. Structures including a rectangular indentation may be formed in the end of the optical fiber. The resonator may be placed against edges of the structures, to hold a different portion of the resonator spaced from an area where the waveguide modes will emanate.

25 Claims, 11 Drawing Sheets

COUPLING SYSTEM TO A MICROSPHERE CAVITY

CROSS-REFERENCE TO RELATED APPLICATIONS

This application is a Continuation In Part of U.S. patent application Ser. No. 09/501,824, filed Feb. 10, 2000 is now U.S. Pat. No. 6,389,197.

STATEMENT AS TO FEDERALLY-SPONSORED RESEARCH

The invention described herein was made in the performance of work under a NASA 7-1407 contract, and is subject to the provisions of Public Law 96-517 (U.S.C. 202) in which the Contractor has elected to retain title.

BACKGROUND

Microsphere resonators have certain desirable characteristics including exceptionally high quality ("Q") factors, and small dimensions. Optical systems often use microsphere resonators as a building block for fiber optic systems. However, it is often necessary to couple optical energy from an optical fiber into the microsphere cavity. The existing couplers often suffer from certain drawbacks.

SUMMARY

This application teaches new ways of launching energy into a resonator device such as a microsphere resonator.

BRIEF DESCRIPTION OF THE DRAWINGS

These and other aspects will now be described in detail with respect to the accompanying drawings, wherein.

DETAILED DESCRIPTION

Figure 1:
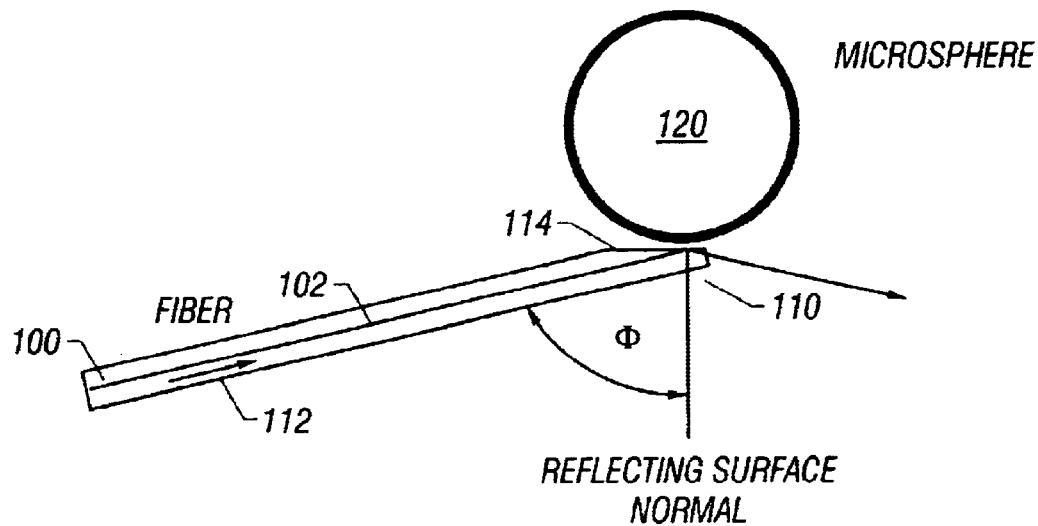
FIG. 1 shows an angle polished fiber coupler system for coupling a microsphere.

FIG. 1 shows the basic schematic embodiment of a first fiber coupler system. A single mode fiber 100 has an end 110 which will be used to couple propagating light 112 into a resonator 120 which can be a microsphere resonator. The single mode fiber 100 is formed with its end area 110 having an angled portion 114. The angled portion 114 forms an angle $\omega=180-\Phi$ with the direction of the axis of the fiber, as shown. The angle $\omega$ is controlled as described herein.

The light is coupled in the direction 112 and incident on the angled surface. Upon incidence, the light propagating inside the core comes into contact with the angled region 114. The light undergoes total internal reflection and then forms an evanescent field around the fiber end 110. Effectively the light escapes the fiber in this way. The microsphere 120 is placed in the area of the evanescent field. The energy from the evanescent field is efficiently exchanged in a resonant mode of the microsphere. Effectively, therefore, the information is resonantly transitioned between the "waveguide" mode of the single mode fiber and the whispering gallery mode in the microsphere.

The angle $\Phi$ is selected to satisfy a phase matching requirement. The angle is selected according to the relationship $\Phi=\arcsin(n_{sphere}/n_{fiber})$. $N_{fiber}$ represents the effective refractive index that describes the guided wave in the fiber core truncation area 110. $N_{sphere}$ represents the effective refraction index that describes the azimuthal propagation of waveguide modes. These can be considered as closed waves, undergoing total internal reflection in the microsphere.

The linear dimensions of the angle-cut core area can match to the area of evanescent field overlap. This allows the system to operate similarly to a prism coupler with illuminated collimation focusing objects.

The effective refraction index can be used to define the azimuthal propagation of the waveguide modes near the surface of the sphere. These can be calculated based on asymptotic expressions for waveguide mode frequencies $\omega_{1q}$, where $n_{sphere}=cl/a\omega_{1q}$. L and q are respectively azimuthal and radial mode indexes, a is the radius of the sphere and c is the speed of light. Different indices can be calculated and used to form a model.

More specifically, the effective index to describe the azimuthal propagation of the WG modes can be calculated as $n_{sphere}=cl/a\omega_{1q}$ on the basis of asymptotic expressions for WG mode "positions" as follows:

$$\omega_{lq} = \frac{nc}{a}\left[v + 2^{-1/3}\alpha_q v^{1/3} - \frac{P}{(n^2-1)^{1/2}} + \left(\frac{3}{10}2^{-2/3}\right)\alpha_q^2 v^{-1/3} - \frac{2^{-1/3}P(n^2-2P^2/3)}{(n^2-1)^{3/2}}\alpha_q v^{-2/3} + O(v^{-1})\right]$$

Again, l, q are azimuthal and radial mode indices respectively; a is the sphere radius; c is the speed of light; n is the refraction index of the sphere material (n=1.4440 (1.4469) for silica at the wavelength $\lambda$=1550 nm (1300 nm)); P=n for $TE_{1mq}$ modes and P=1/n for $TM_{1mag}$ modes; v=1+½; and $\alpha_q$—is the q-th root of the Airy function, Ai(-z), equal to 2.338, 4.088, 5.521 for q=1,2,3 respectively. Results of calculation of $n_{sphere}$ (at both wavelengths 1550 nm and 1300 nm) for silica spheres of different radii are given in FIG. 2. The calculation is made for three lowest radial order modes TE $(TM)_{1mq}$, q=1,2,3.

Since the guided wave in the core no longer exists after reflection, precise calculation of $n_{fiber}$ is a non-trivial task implying the explicit computation of the evanescent field in the truncation area. However, as confirmed by the experiments below, a consistent recipe for a functional coupler can be based on a straightforward approximation that assumes $n_{fiber}$ equal to the effective mode index in a regular fiber.

In a specific embodiment, the standard Corning SMF-28 fiber is used with the germanium-doped core of diameter $2a=8.3$ μm and index difference of 0.36%. The material index of the core was $n_1 =1.4505$; the material index of the cladding $n_2 =1.4453$ at the wavelength λ=1550 nm, and correspondingly $n_1 =1.4535$ and $n_2 =1.4483$ at λ=1300 nm (Corning Inc Product Information sheet PI1036, 1998). As known from the theory of step-index fibers (see e.g. L. B. Jeunhomme, Single-Mode Fiber Optics (Marcel Dekker, N.Y., 1983)), propagation constant □ for the core-guided mode can be approximated as follows:

$$\beta \approx kn_2\left[1 + \Delta\left(\frac{v}{V}\right)^2\right],$$

where $k=2\pi/\lambda$—is the free-space wave vector; $\Delta=(n_1-n_2)/n_2$—the relative index difference; v is the normalized transverse decay constant; $V=k\, n_2\, (2\Delta)^{1/2}$—the normalized frequency. Using standard solution v(V) for the fundamental $LP_{01}$ mode of the fiber and the parameters of our fiber, the effective index relevant to the phase-matching condition is $n_{fiber}$ β/k=1.4476 at 1550 nm and $n_{fiber}$=1.4509 at 1300 nm.

Figure 2:
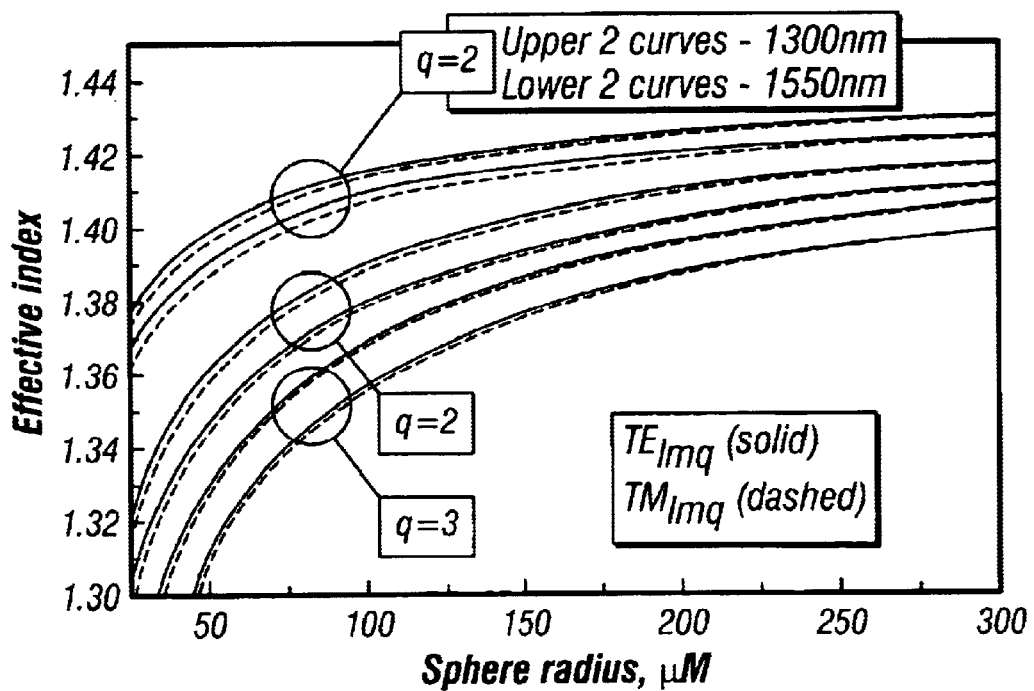
FIG. 2 shows a model of sphere radius verses fiber characteristic.

One exemplary model is shown in FIG. 2. In this model, different results of calculations are presented for different q values, at the frequency and for different resonators of different characteristics.

Another issue comes from the way in which the fiber and the modes operate after reflection from the truncation plane. After this reflection, the guided wave in the fiber no longer exists. Precise calculation of $n_{fiber}$ becomes difficult. This value is assumed to be equal to the effective index $n_{guide}$ of the $n_{guided}$ wave and the regular fiber, although the precise value may be difficult to obtain.

Figure 3A:
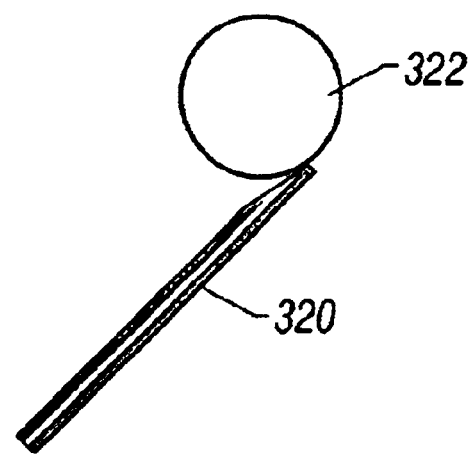
FIGS. 3A and 3B show single mode fibers and a resonator.
Figure 3B:
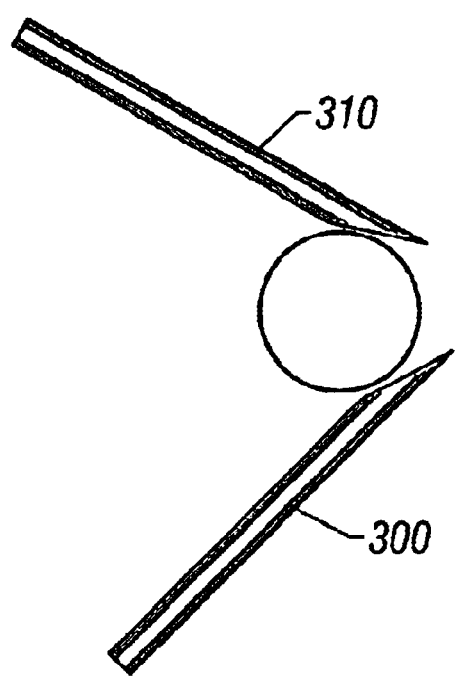

The specific way in which the system is used is shown in FIGS. 3A and 3B. A close up view of the assembly has two fiber couplers 300, 310, each with cleaved ends as described herein. The polishing angles of the fibers are about 12.1 degrees and 13.3 degrees respectively or Φ=77.9° and 7.6°. A fused silica rod 320 supports the microsphere 322 at a radius 235 μm between two angled conical fiber couplers. The optical information can be updated between the fibers, via the sphere.

The above has described one way of coupling optical energy into such a microsphere. Since evanescent waves are used for the energy coupling, this is effectively near-field coupling.

The principle implemented in the above description of a single mode optical fiber coupler can also be extended to use integrated optic waveguides.

Figure 4A:
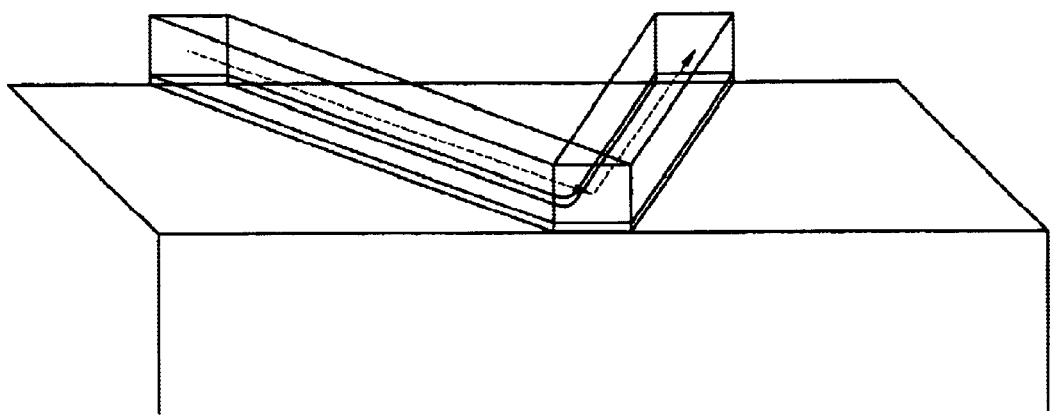
FIGS. 4A and 4B shown an embodiment using this waveguide to whispering mode technique for coupling between different waveguides.

FIG. 4A shows a total internal reflection mirror on a channel waveguide that provides a phase-matched excitation coupler for WG modes. The cutting angle Φ is defined, as previously, from the effective index of the guide and the effective index of azimuthal propagation of WG mode in particular sphere. Because of the high index available with planar semiconductor waveguides ($n_{guide}$=3.0–3.5), optimal coupling can be achieved with wide variety of cavity materials, by adjusting the angle Φ in accordance with the relation Φ=arcsin ($n_{sphere}/n_{guide}$).

Figure 4B:
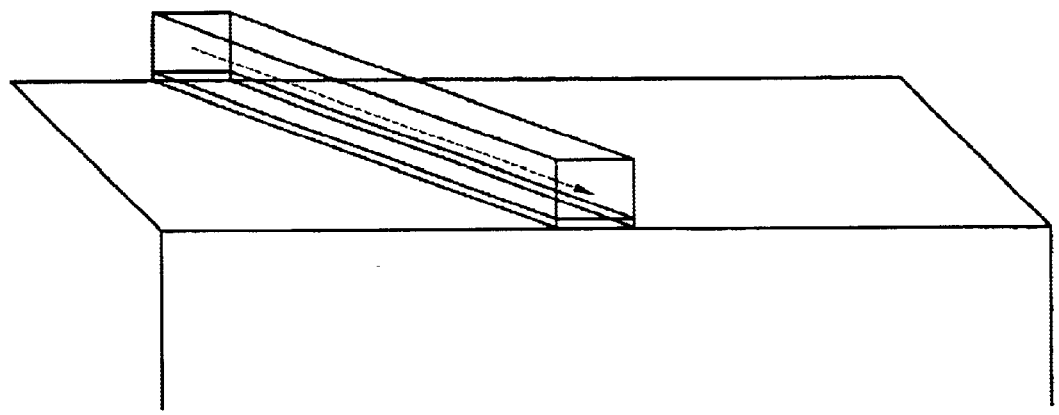

For example, if InP waveguides having an n=3.17 are on an InGaAsP supporting layer (n=3.50) over an InP substrate, the effective index for 3 μm ×3 μm cross section will be $n_{guide}$=3.30. The optimal angle for excitation of $TE_{1m1}$ whispering gallery modes in 200 μm diameter fused silica sphere Φ=25°, all near the wavelength 1550 nm. The configuration depicted in FIG. 6 can be fabricated by CVD (chemical vapor deposition) methods, lithography, wet etching, and subsequent cleaving of the wafer to provide a flat mirror surface at the reflection plane. More consistent results may be obtained with ion-assisted etching, or "IAE". If only input coupling is required, the waveguide may be simply truncated as shown in FIG. 4B at the cleave. No folded mirror is necessary, even though that could further simplify the fabrication. Although configuration of the optical field may be disturbed because of mode transformation in the truncation area, the phase-matched coupling can still be achieved, with adjustment or experimental trimming of the truncation angle.

Figure 5A:
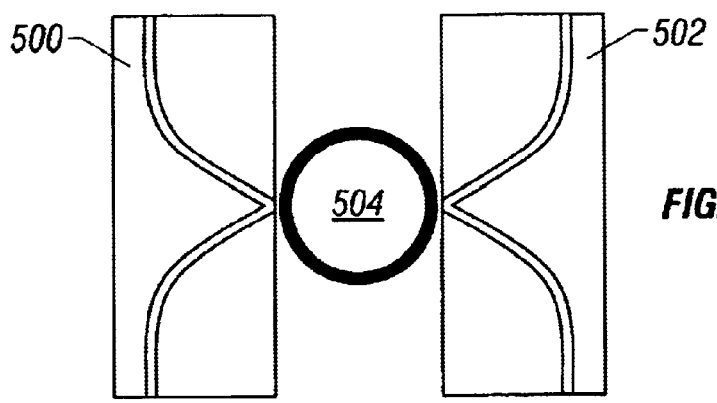
FIGS. 5A–5D show an embodiment for forming the waveguides on a chip and forming a resonator near the waveguides.
Figure 5B:
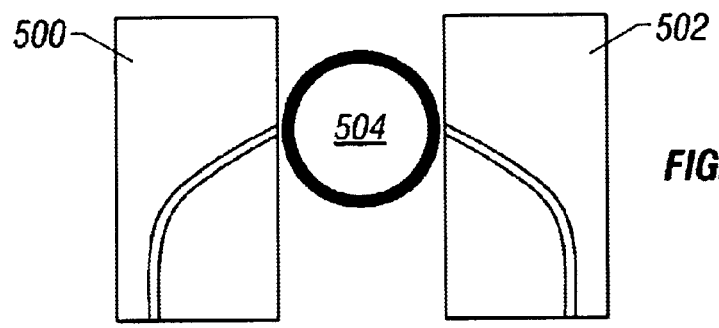

A corner reflector, or truncated guide can be formed on the edge of a substrate as shown in FIG. 4A. The throughput configuration, which is the analog of Figure 3B, can be achieved by assembling two chips at 500, 502. The sides of a microsphere 504 can be arranged as shown in FIGS. 5A and 5B. Alternatively, the couplers can be formed in the central part of the chip 510, next to a through hole or a micromachined depression 512 that will house a microcavity 504 as shown in FIG. 5C.

Figure 5C:
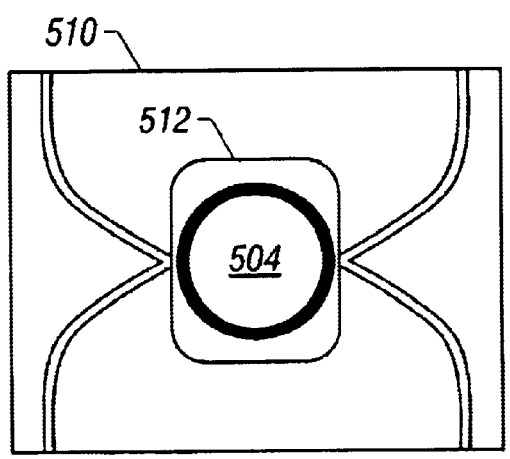
Figure 5D:
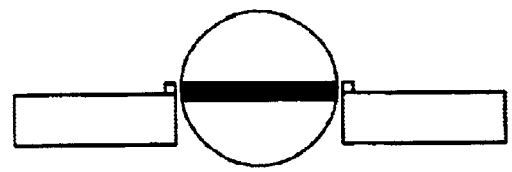

In any of FIGS. 5A–5C, the sphere 504 is arranged relative to the chip 500 as shown in FIG. 5D. Preferably the central diameter line of the sphere 500 is at or around the chip surface. This can facilitate holding the chip into place.

FIG. 5 shows the embodiments incorporating a microsphere cavity. The described method of coupling is applicable to all types of waveguide mode cavities ★★ (including disks, rings etc.). It also provides a tool to achieve efficient coupling between integrated optics components of different materials and substrates.

Figure 6A:
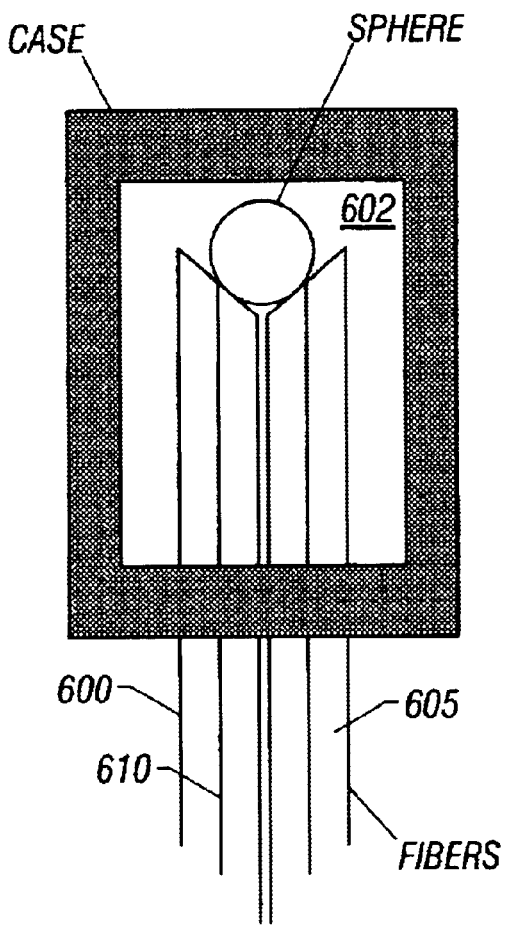
FIGS. 6A–6C show details of a system for doing this using optical waveguides.
Figure 6B:
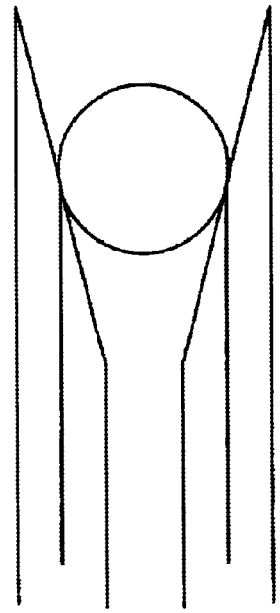
Figure 6C:
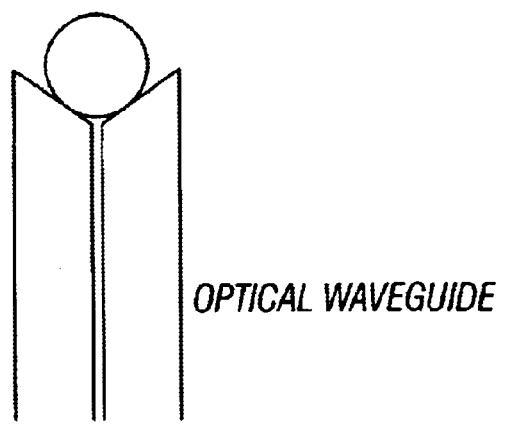

FIG. 6 shows a filter element including a waveguide microcavity within a case collinear input and output fibers/waveguides 605, 610 using a sphere for filtering non-resonant paths.

FIG. 6 shows an embodiment of device integration of a novel waveguide coupler element for waveguide modes in microspheres. A coupled optoelectronic oscillator (COEO) is based on a high-Q microsphere. COEO is a variant of a microwave optoelectronic oscillator, OEO (X. S. Yao, L. Maleki, JOSA B, Vol.13, no.8, pp.1725–35, 1996), which is a microwave oscillator that uses optical energy storage elements to achieve high spectral purity signals at frequencies ranging from hundreds of MHz to above 100 GHz. These devices, normally have a laser, optical modulator, detector, microwave amplifier and fiber-optic delay, optoelectronic oscillator. Each of these devices can be implemented on a single chip except for the relatively bulky delay element. By using a miniature optical cavity such as a microsphere, the entire device can be placed on a chip.

The waveguide coupling element described herein facilitates the incorporation of a microsphere in the OEO-on-chip, thereby simplifying the setup. To operate with an optical cavity, the laser in the OEO requires locking to one of the modes of the cavity. Oscillation will occur as the microwave modulation sidebands coincide with adjacent cavity modes.

To eliminate the need for independent laser locking to cavity modes, the high-Q cavity can be incorporated into the laser resonator. An additional modulation feedback loop will ensure microwave oscillation. This is described in, "coupled OEO," (X. S.Yao, L. Maleki, Opt.Lett., Vol.22, No.24, pp.1867–9, 1997).

Figure 7:
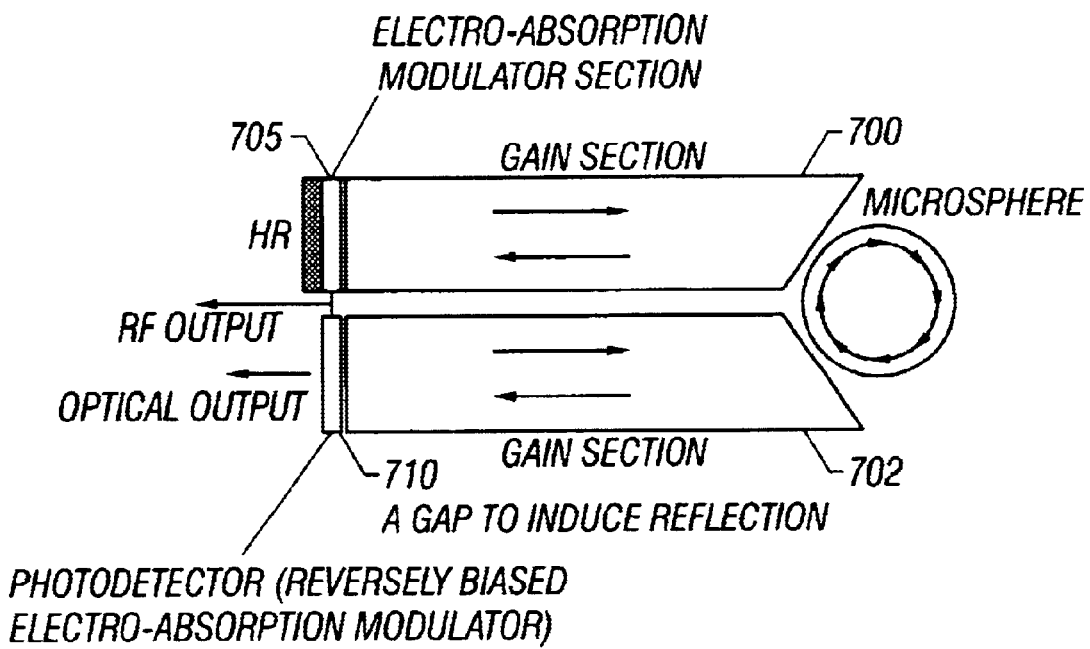
FIG. 7 shows an embodiment of carrying out electro-optical absorption on a chip.

The embodiment of COEO-on-chip, is shown in FIG. 7. When activated by a current source, the active waveguides 700, 702 provide gain for the laser system. Electro-absorption modulators 705 are fabricated at the ends of waveguides by etching out the insulating gap to separate electrodes of gain sections from modulator sections. The upper electroabsorption modulator is coated with a high-reflectivity coating to induce pulse colliding in the modulator and thus enhance the mode locking capability. At the lower section 702, the gap 710 between the electroabsorption modulator and the waveguide is etched deeper to induce optical separation. The gap interface acts as a partial mirror to reflect light back to the lower guide and form a laser cavity together with high-Q microsphere and the upper waveguide terminated by a high reflectivity mirror. The lower electroabsorption modulator is reverse biased so that it acts as a photodetector. The output from the photodetector is connected to the upper electroabsorption modulator via a relatively simple matching circuit, to induce microwave oscillation. Because the photodetector and the E/A modulator are essentially the same device, they have similar impedances to the order of few K-Ohms. Thus, these devices are essentially impedance matched. Taking typical values of a 2 Volt modulator switching voltage, a 1 kOhm of modulator and photodetector impedance, and 0.5A/W of photodetector responsivity, the optical power required for sustained RF oscillation can be estimated at only 1.28 mW. Such an optical power is easily attainable in semiconductor lasers. This avoids the need for an RF amplifier, which can be a source of the proposed COEO design.

A second embodiment describes far field coupling, using a refractive index grating that is written onto the sphere surface. The grating can be written by shining a pattern of ultraviolet light onto a doped surface. The surface can be doped with germanium in order to increase its photosensitivity.

The microsphere is formed as follows. First, a fused silica sphere is made in a typical way, such as by fusing a preform in a small flame. A 3–5 $\mu$m thick photosensitive layer is then deposited by melting germanium oxide doped glass powder. The quality factor of the resulting sphere is about $10^8$ at $\lambda$=15–50 nanometers.

Figure 8:
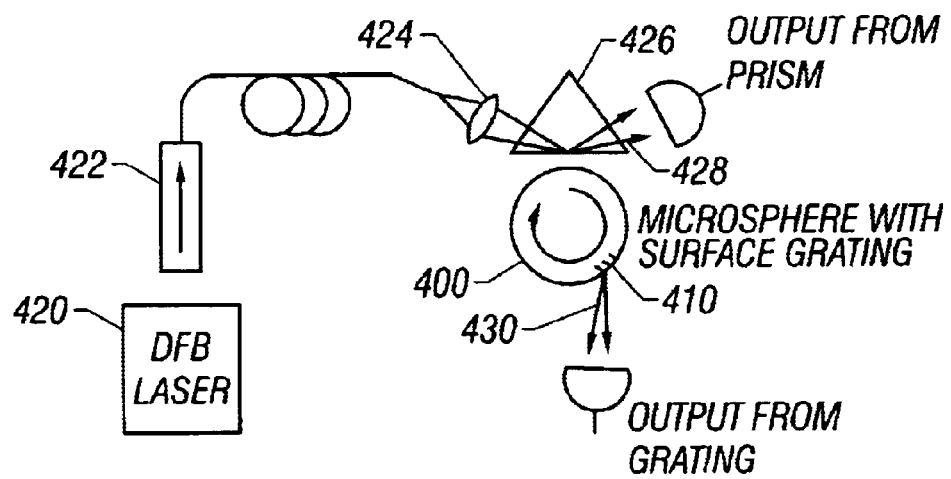
FIG. 8 shows an embodiment which couples light into a resonator using a surface grating.

The photosensitive layer is then used to form a surface grating 410 on the microsphere. 40 milliwatts of a 244 nanometer UV light is used from a frequency-doubled argon laser for 5 to 10 minutes. This forms an index of modulation of about $10^{-4}$ with a grating period of 2 $\mu$m and a grating length of about 15 $\mu$m. This grating will form first order phase matching of a whispering gallery mode and a free space beam that is oriented at about 15 to 45° to the microsphere surface. The coupling of the optical information to the microsphere is shown in FIG. 8. The microsphere 400 is also formed with surface grating 410.

A laser 420 produces laser light which is confined within a waveguide 422 that can be, for example, an optical fiber.

Collimating lens 424 receives optical energy from the waveguide. The optical energy is coupled to a prism 426. The prism can produce both input and output waves, the output wave being shown as 428. Light is also coupled into the microsphere from the prism. The grating 410 produces an output 430.

A technique of fabricating the cavity for a micro-sized resonator system, capable of supporting whispering gallery modes, is also disclosed. This device can be used with any of the embodiments described previously.

Silica microspheres can support whispering gallery modes based on their precise shaping and undercutting. A problem, however, is that many of the microspheres with the highest quality have been hand-fabricated in the laboratory.

The system herein forms a whispering gallery mode in a dielectric body having axial symmetry e.g. a sphere, ellipsoid disk, ring or the like. The microspheres that are described herein can actually be any of these shapes, or can be any other shaped resonator. This system can be modeled by closed waves undergoing continuous total internal reflection. The resonances described herein correspond to completion of an integer number of wavelengths packed along the closed trajectory.

Figure 9A:
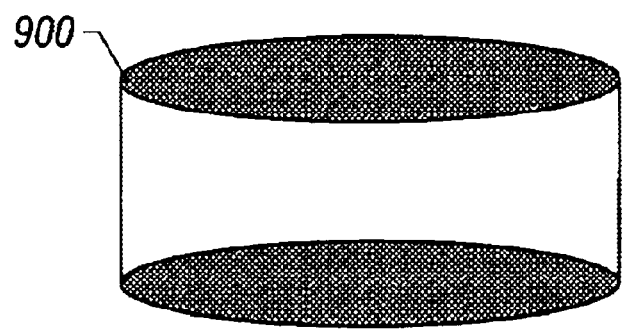
FIGS. 9A–9C shows steps of formation of a improved resonator.
Figure 9B:
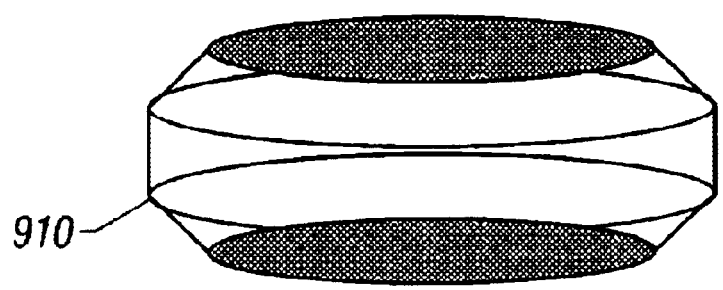
Figure 9C:
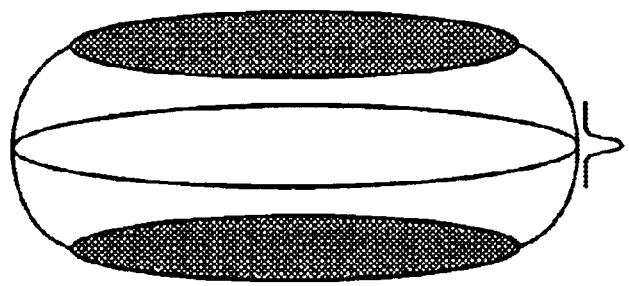

The fabrication is shown with reference to FIGS. 9A–9C. A cylindrical cavity preform of silica is formed with vertical walls as shown in FIG. 9A. In this example, the walls have a diameter 100 to 200 $\mu$m, a thickness of 20 to 40 $\mu$m, and are on a relatively flat substrate.

The vertical surface of the vertical walls is next re-shaped to provide removal of the mode field from the flat boundaries as shown in FIG. 9B. This is done by removing the edge portions 900 forming a complex shape shown in FIG. 9B. After that, further thermal and mechanical treatment is used to approach ellipsoidal geometry. The edges, e.g. 510, are rounded and smoothed to minimize surface roughness and reduce radiation loss. By rounding these surfaces, curvature confinement and fire polish grade surface can be obtained, obtaining a Q approaching $10^8$.

The cylindrical preform described in FIG. 9A can be produced by wet/dry etch as well as ion milling techniques using appropriate crystal orientation. Other techniques such as RTA laser treatment, ultraviolet treatment and infrared treatment can also be used.

The above has described a fiber/waveguide coupling method for high Q optical microsphere cavities operating in whispering gallery modes. The techniques as disclosed above operated by angle polishing the fiber waveguide tip to phase synchronize between the waveguide modes and the evanescent wave in the area of total internal reflection of the waveguide mode. This technique may enable compact packaging solutions for various devices. The devices may be based on microspheres and other whispering gallery mode micro cavities. For example, the whispering gallery mode micro cavities may include the recently discovered highly oblate spheroidal cavities also called micro torouses.

For maximum efficiency in the energy exchange between the fiber/waveguide and the micro cavity, a number of conditions should coincide. The first, the fiber/waveguide should be positioned with its core section area at the epicenter of proximity with the microsphere. The axis of the fiber should also will exist in the symmetry plane of the waveguide mode localization. An air gap is often maintained between the core section of the fiber and the microsphere. This airgap should be maintained stable within the range of the evanescent wave, typically in the range between 500 and 1500 nm.

Figure 10:
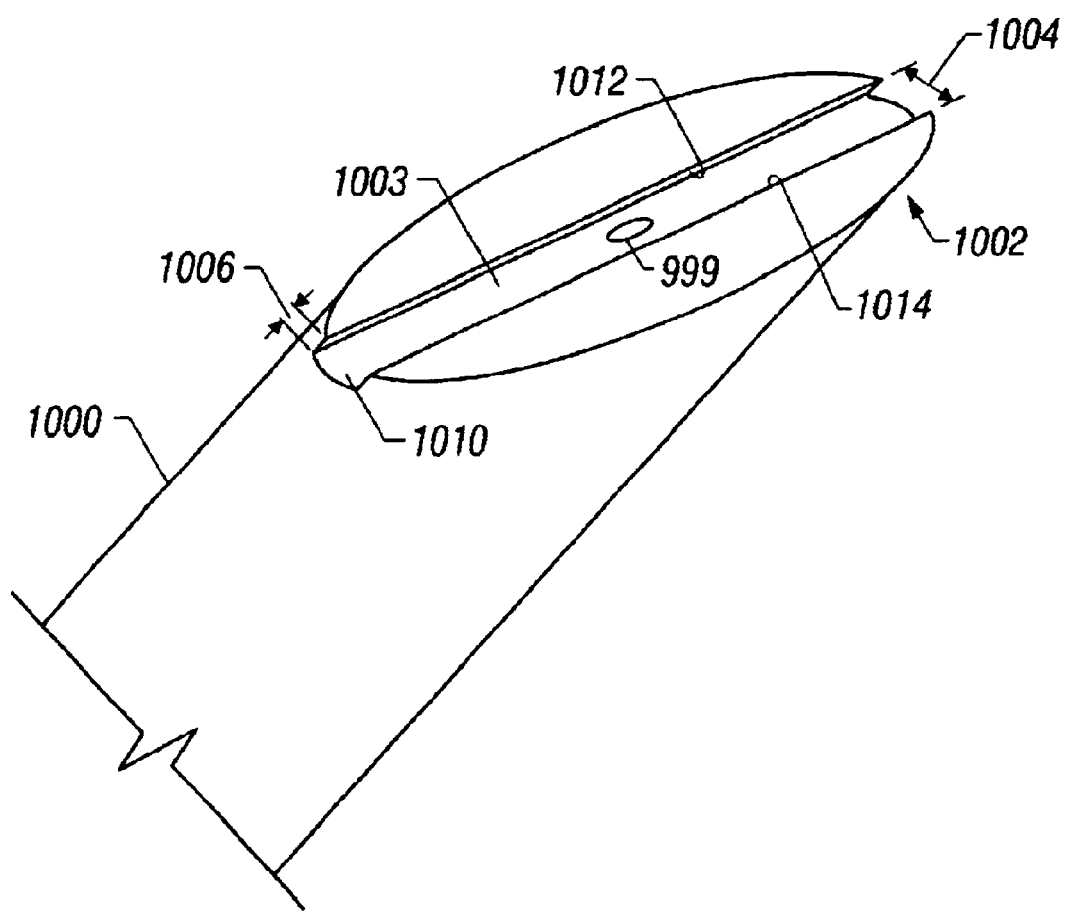
FIG. 10 shows an improved coupler to a resonator.
Figure 11:
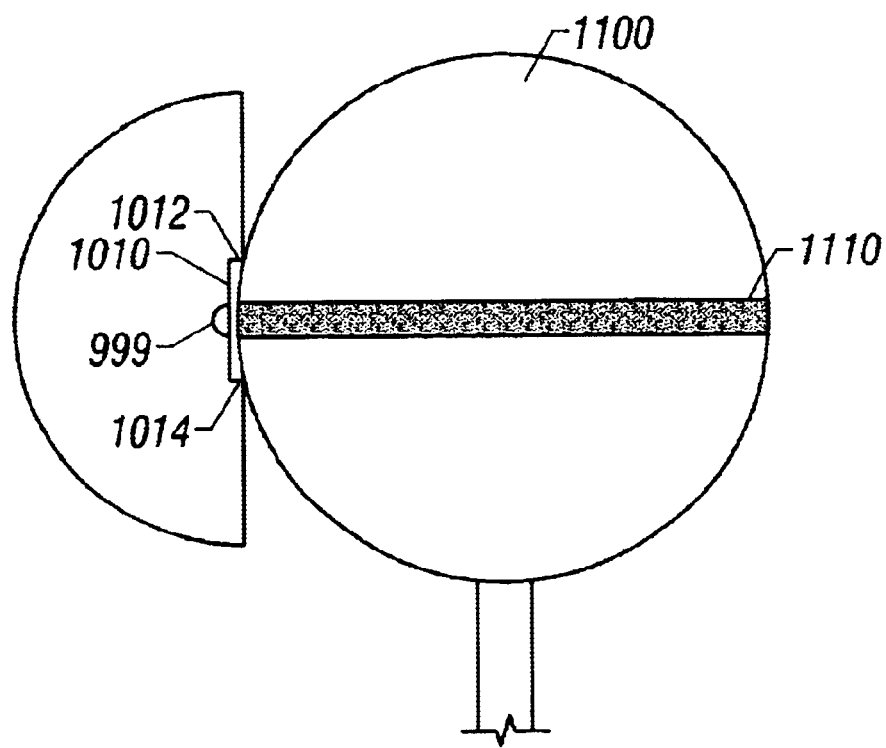
FIG. 11 shows a resonator being brought into contact with a fiber, and the resultant "belt of light"
Figure 12:
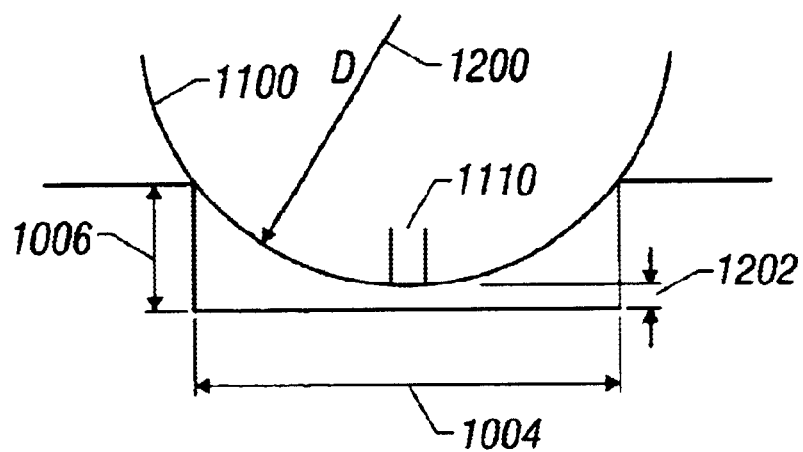
FIG. 12 shows the structural configuration of the device including its airgap.

The following embodiment discloses a modification of the fiber coupler that enables self alignment of the fiber core with respect to the micro cavity, and may stabilize the airgap, accordingly. The present system configuration of the coupler is shown in FIG. 10. The fiber waveguide 1000 is fabricated with a rectangular groove 1010 in the angled end portion 1002 of the fiber. The fiber core 999 passes through the bottom surface 1003 of this groove 1010. The width 1004 of the groove should be much less than the diameter of the microsphere, for example 1/10 to 1/3 the diameter of the microsphere. FIG. 11 shows the microsphere 1100 being brought into mechanical contact with the walls 1012, 1014 of the trench 1010. This contact will not substantially affect the performance of the Micro cavity because of the way the system is configured. The waveguide modes emanating from the core 999, and are localized according to a "belt of light" which surrounds the sphere in the area of the core. The belt of light is shown as 1110 in FIG. 11. In fact, the shape of this belt of light is only truly relevant in the area of the contacts, and the belt of light may diverge in other areas. This belt of light is fully accommodated between the walls of the trench, and hence nowhere within this belt of light does the microsphere element actually contact the trench. The width 1004 of the trench can be calculated for any particular diameter of sphere 1100 in order to accommodate the area of the waveguide mode. The depth 1006 of the trench may be selected as equal to the height of the circular segment of the diameter of the microsphere and the width 1004 of the trench. the depth of the desired airgap is shown as 1202. The different characteristics are shown in FIG. 12 including the diameter 1200 of the microsphere 1100, the width of the trench 1004, the depth of the trench 1006, and the airgap amount 1202.

For example, for a 200 micron microsphere, a suitable trench which may be 25 microns with a depth of two microns in order to obtain a gap 1202 of about one micron in the coupling area 1110.

Figure 13:
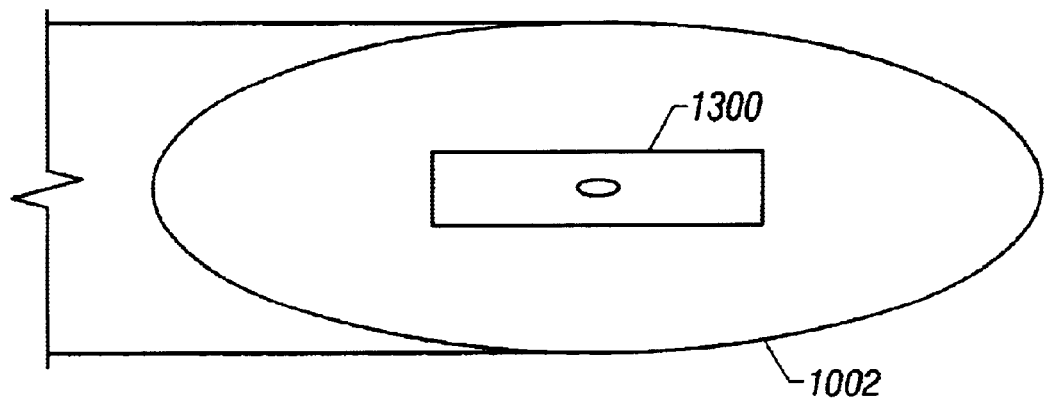
FIGS. 13 and 14 show different configurations of the trench.

Other modifications may be carried out to improve the operation. For example, the trench might not extend over the full-length of the coupler as shown in FIG. 10. Instead, as shown in FIG. 13, the trench may be a rectangular depression 1300 over a certain portion of the area of the fiber tip 1002. The aspect ratio between length and width of the depression may be selected, and a sufficient aspect ratio may be two or 3.

Figure 14:
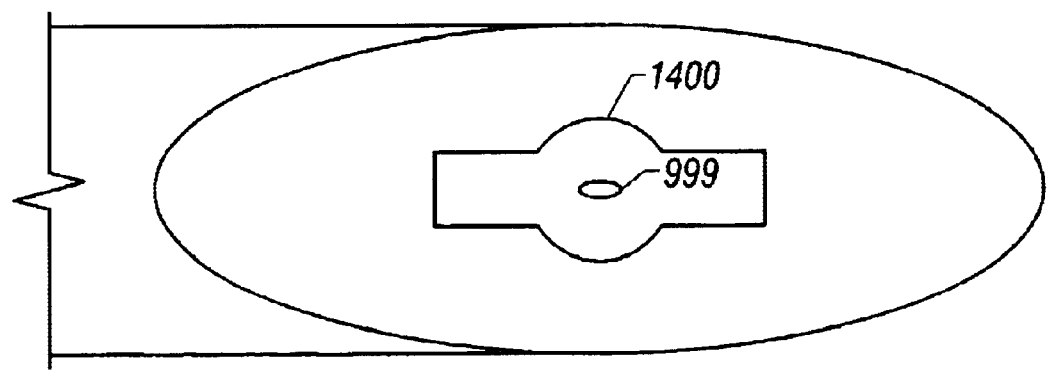

An additional embodiment, shown in FIG. 14, may carry out lateral self alignment in the addition to the axial positioning alignment carried out by the embodiment of FIG. 10. In the FIG. 14 embodiment, a circular shaped depression 1400 is also added in an area around the core 999. Similar techniques to those described above may be used to estimate the necessary depth of the trench, except for the trench being is substituted with the diameter of the cutout 1400.

Figure 15:
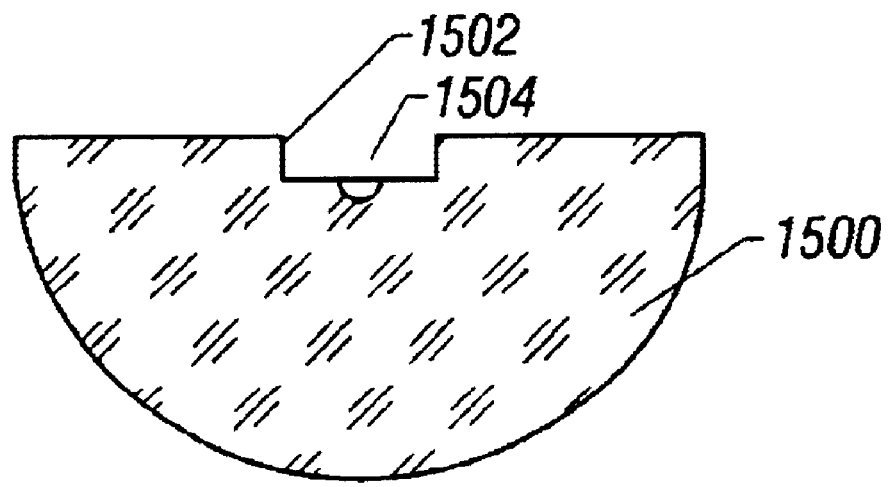
FIGS. 15 and 16 show the formation of the trench.
Figure 16:
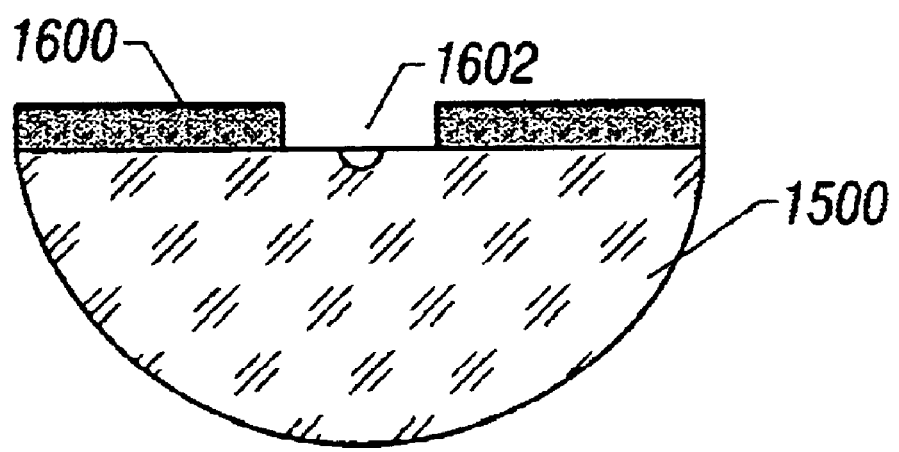

The fabrication can be carried out as shown in FIGS. 15 and 16. In a first fabrication technique shown in FIG. 15, the silica fiber material 1500 is etched using either wet etching or reactive ion etching to form the trench 1502. This etching technique, however, may increase the roughness of the total internal reflection surface at the bottom of the trench 1504. Accordingly, this may moderately contribute to the insertion loss. However, since these techniques are well-established, the rim may be expected to have higher rigidity.

A second technique shown in FIG. 16 forms an additional covering 1600 over the silica substrate 1500. This additional covering may include solid metal, oxide, or organic film. The covering may be deposited on the surface or actually within the surface. A soft metal such as gold, for example, can be used to achieve post productive trimming using piezo controlled indentation of the sphere against the coupler while observing waveguide mode resonance. This technique has the advantage that the surface 1602 remains as being the original surface and hence this does not affect of the flatness of the total reflection surface.

Although only a few embodiments have been disclosed in detail above, other modifications are possible. For example, while the above describes the resonators as being spheres, it should be understood that the resonators can be any shape, although resonators with curved outer surface shapes may be advantageous. All such modifications are intended to be encompassed within the following claims.

What is claimed is:

1. An apparatus comprising:
   a fiber, having a core and a clad, and having an end portion, said end portion formed with an indentation portion with first and second opposing edges, and a lower surface portion being lower than said first and second opposing edges, and wherein said core portion of said fiber is between said first and second opposing edges.

2. An apparatus as in claim 1, further comprising a resonator, having a curved outer surface, which is pressed against both said first and second opposing edges.

3. An apparatus as in claim 2, wherein said curved outer surface is spaced by a specified amount from said lower surface portion when pressed against said first and second opposing edges.

4. An apparatus as in claim 3, wherein said specified amount is one micron.

5. An apparatus as in claim 3, wherein a minimum amount of said specified amount is at an area where said core portion is located.

6. An apparatus as in claim 1, further comprising a second curved surface, forming holding areas outside of said first and second opposing edges.

7. An apparatus as in claim 6, wherein said second curved surface is substantially round, and is centered around an area of said core.

8. An apparatus as in claim 6, wherein said indentation portion extends by only a specified amount over a surface on said fiber, where said specified amount is less than a distance from 1 outer edge of the fiber to the other outer edge of the fiber.

9. An apparatus as in claim 6, further comprising a resonator element with a curved outer wall, coupled to be held between surfaces of said curved outer surface.

10. An apparatus as in claim 1, wherein said indentation portion has substantially vertical sidewalls, and a substantially flattened bottom.

11. An apparatus as in claim 10, wherein said core is in a central portion between said substantially vertical sidewalls.

12. An apparatus as in claim 1, wherein said end portion of said fiber is a cleaved end portion which is cleaved at a specified angle which is non 180 degrees relative to an axis of the fiber.

13. An apparatus as in claim 12, wherein said specified angle is 45 degrees.

14. An apparatus as in claim 1, wherein said indentation portion is a substantially rectangular groove.

15. An apparatus as in claim 1, wherein said indentation portion extends substantially from one outer edge of the fiber to the other outer edge of the fiber.

16. An apparatus as in claim 1, wherein said indentation portion extends by a specified amount on a surface of said fiber, said specified amount being less than a distance from one outer edge of the fiber to the other outer edge of the fiber.

17. An apparatus as in claim 1, further comprising a resonator element, coupled to surfaces of said fiber.

18. A method, comprising:
   conducting light within an optical fiber to an edge portion of the optical fiber; and
   placing a resonator within a proximity of said edge portion of said optical fiber in a way such that a portion of said resonator is pressed against first surfaces of said optical fiber, and another portion or said resonator is spaced from second surfaces of said optical fiber, said second surfaces of said optical fiber including surfaces including a core of said fiber.

19. A method as in claim 18, wherein said edge portion of said optical fiber comprises edge portions defining a notch in the portion of the optical fiber.

20. A method as in claim 19, wherein said end portion of said optical fiber is a cleaved end portion.

21. A method as in claim 20, wherein said notch is formed by a rectangular indentation in the end of the optical fiber.

22. A method as in claim 21, further comprising conducting light to a location within said rectangular indentation.

23. A method as in claim 21, wherein said placing comprises pressing curved surfaces of said resonator against edges of maid rectangular indentation.

24. A method as in claim 23, wherein said curved surface of said resonator are spherical surfaces.

25. A method as in claim 18, wherein said placing comprises placing curved surfaces of a resonator against corresponding curved surfaces formed on an end of said optical fiber.

\* \* \* \* \*